(12) United States Patent
Ku

(10) Patent No.: US 7,951,682 B2
(45) Date of Patent: May 31, 2011

(54) METHOD FOR FABRICATING CAPACITOR IN SEMICONDUCTOR DEVICE

(75) Inventor: Soung-Min Ku, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 207 days.

(21) Appl. No.: 12/434,716

(22) Filed: May 4, 2009

(65) Prior Publication Data

US 2010/0055861 A1 Mar. 4, 2010

(30) Foreign Application Priority Data

Aug. 29, 2008 (KR) ........................ 10-2008-0085097

(51) Int. Cl.
*H01L 21/20* (2006.01)
(52) U.S. Cl. ........ 438/397; 438/238; 438/247; 438/256; 438/398; 438/758; 257/E21.038; 257/E21.314; 257/E21.649; 257/E27.038; 257/E27.094
(58) Field of Classification Search .......... 438/239–268, 438/396–398, 745–758; 257/E21.038, 314, 257/648–651, 27.038, 94
See application file for complete search history.

(56) References Cited

U.S. PATENT DOCUMENTS

| | | | | |
|---|---|---|---|---|
| 5,547,893 A * | 8/1996 | Sung | ............................. | 438/207 |
| 5,966,611 A * | 10/1999 | Jost et al. | ....................... | 438/397 |
| 6,162,671 A * | 12/2000 | Lee et al. | ....................... | 438/238 |
| 6,177,307 B1 * | 1/2001 | Tu et al. | ......................... | 438/241 |
| 6,362,042 B1 * | 3/2002 | Hosotani et al. | ............... | 438/253 |
| 6,563,161 B2 * | 5/2003 | Sheu et al. | ..................... | 257/306 |
| 6,589,837 B1 * | 7/2003 | Ban et al. | ....................... | 438/239 |
| 6,768,154 B2 * | 7/2004 | Miyajima | ...................... | 257/301 |
| 6,812,090 B2 * | 11/2004 | Lee | ................. | 438/240 |
| 6,927,143 B2 * | 8/2005 | Lee | ................. | 438/397 |
| 7,029,970 B2 * | 4/2006 | Ahn | ............................. | 438/239 |
| 7,074,670 B2 * | 7/2006 | Park et al. | ..................... | 438/253 |
| 7,125,766 B2 * | 10/2006 | Kim et al. | ...................... | 438/253 |
| 7,235,452 B2 * | 6/2007 | Kang et al. | .................... | 438/396 |
| 7,253,052 B2 * | 8/2007 | Fazan et al. | ................... | 438/256 |
| 7,338,610 B2 * | 3/2008 | Lee et al. | ........................ | 216/13 |
| 7,476,625 B2 * | 1/2009 | Lee et al. | ...................... | 438/758 |

(Continued)

FOREIGN PATENT DOCUMENTS

KR 1020040024443 3/2004

(Continued)

OTHER PUBLICATIONS

Notice of Allowance issued from Korean Intellectual Property Office on Sep. 3, 2010.

*Primary Examiner* — Michael S Lebentritt
(74) *Attorney, Agent, or Firm* — IP & T Group LLP

(57) ABSTRACT

A method for fabricating a capacitor in a semiconductor device includes forming an insulation layer over a substrate, forming a storage node contact plug passing through the insulation layer and coupled to the substrate, recessing the storage node contact plug to a certain depth to obtain a sloped profile, forming a barrier metal over the surface profile of the recessed storage node contact plug, forming a sacrificial layer over the substrate structure, etching the sacrificial layer to form an opening exposing the barrier metal, forming a bottom electrode over the surface profile of the opening, and removing the etched sacrificial layer.

9 Claims, 4 Drawing Sheets

U.S. PATENT DOCUMENTS

| | | | |
|---|---|---|---|
| 7,655,968 B2 * | 2/2010 | Manning | 257/302 |
| 2002/0109155 A1 * | 8/2002 | Shin et al. | 257/202 |
| 2004/0051130 A1 * | 3/2004 | Miyajima | 257/301 |
| 2005/0106808 A1 * | 5/2005 | Yu et al. | 438/253 |
| 2008/0017908 A1 * | 1/2008 | Cho et al. | 257/311 |

FOREIGN PATENT DOCUMENTS

| | | |
|---|---|---|
| KR | 1020040025540 | 3/2004 |
| KR | 1020050000869 | 1/2005 |
| KR | 1020070075532 A | 7/2007 |

* cited by examiner

METHOD FOR FABRICATING CAPACITOR IN SEMICONDUCTOR DEVICE

CROSS-REFERENCE TO RELATED APPLICATIONS

The present invention claims priority of Korean patent application number 10-2008-0085097, filed on Aug. 29, 2008, the disclosure of which is incorporated by reference herein in its entirety.

BACKGROUND OF THE INVENTION

The present invention relates to a method for fabricating a semiconductor device, and more particularly, to a method for fabricating a capacitor in a semiconductor device.

Due to the large integration scale of semiconductor devices, the minimum line width is becoming smaller and the scale of integration is becoming greater. Consequently, the area on which a capacitor is to be formed is also becoming smaller. However, a capacitor in a cell generally needs to secure a high level of capacitance which is required in each cell even though the size of the area for forming a capacitor is becoming smaller. Thus, a method for fabricating a cylinder type capacitor wherein a sacrificial layer between capacitors is removed has been introduced.

Meanwhile, barrier metals are used to reduce a contact resistance and improve adhesion to bottom layers when forming a bottom electrode.

However, as the large scale integration continues to improve, the bottom size of a capacitor also continues to decrease. Consequently, the size of the contact area with a bottom storage node contact plug decreases, resulting in limitations in reducing the contact resistance.

Furthermore, a titanium layer, which is often used as barrier metals, shows an insufficient level of deposition capacity toward the bottom area. Thus, it is difficult to improve a contact resistance (Rc).

Moreover, after a barrier metal and a conductive layer are formed, residues of the barrier metal may remain after an isolating etch process is performed for forming a bottom electrode. Thus, bridges between capacitors may occur due to such residues. If a supporting layer is formed to prevent a collapse of a bottom electrode during a dip out process, more bridges may occur between capacitors because of the residues.

SUMMARY OF THE INVENTION

Embodiments of the present invention are directed to providing a method for fabricating a capacitor in a semiconductor device, which can improve a contact resistance of a capacitor.

The embodiments of the present invention are also directed to providing a method for fabricating a capacitor in a semiconductor device, which can prevent bridges from occurring between capacitors.

In accordance with an aspect of the present invention, there is provided a method for fabricating a capacitor in a semiconductor device, including: forming an insulation layer over a substrate; forming a storage node contact plug passing through the insulation layer and coupled to the substrate; recessing the storage node contact plug to a certain depth to obtain a sloped profile; forming a barrier metal over the surface profile of the recessed storage node contact plug; forming a sacrificial layer over the substrate structure; etching the sacrificial layer to form an opening exposing the barrier metal; forming a bottom electrode over the surface profile of the opening; and removing the etched sacrificial layer.

DESCRIPTION OF SPECIFIC EMBODIMENTS

Other objects and advantages of the present invention can be understood by the following description, and become apparent with reference to the embodiments of the present invention.

Embodiments of the present invention relate to a method for fabricating a capacitor in a semiconductor device. According to the embodiments, a storage node contact plug is recessed to a certain depth to have a sloped profile and a barrier metal is formed over the recessed storage node contact plug so that a contact area increases by as much as the sloped profile, thereby reducing a contact resistance.

Furthermore, a bottom electrode is formed after forming a barrier metal over a recessed storage node contact plug so that a storage capacity (Cs) is secured by as much as the recessed portion of the storage node contact plug without increasing the height of a capacitor. Also, recessing the storage node contact plug provides a greater supporting strength at the bottom than when forming a bottom electrode having a flat bottom profile. Thus, the bottom electrode is unlikely to collapse during a dip out process.

Moreover, forming a barrier metal locally over a storage node contact plug prevents residue generation, which may be caused by a selectivity between layers, when forming an adhesive layer for adhesion of a bottom electrode. Therefore, bridges between capacitors, which are often generated by the residues, may be prevented from being formed.

The embodiments of the present invention will be described in detail with reference to the accompanying drawings so that those ordinary persons skilled in the art may be able to embody the present invention with ease.

FIGS. 1A to 1H illustrate cross-sectional views of a method for fabricating a capacitor in a semiconductor device in accordance with an embodiment of the present invention.

Figure 1A:
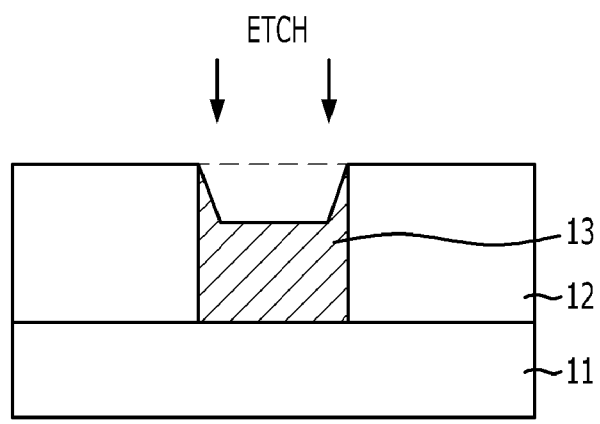
FIGS. 1A to 1H illustrate cross-sectional views of a method for fabricating a capacitor in a semiconductor device in accordance with an embodiment of the present invention.

Referring to FIG. 1A, an insulation pattern 12 and a recessed storage node contact plug 13 are formed over a substrate 11.

In detail, an insulation layer for forming the insulation pattern 12 is formed over the substrate 11. The substrate 11 may be a semiconductor substrate on which a dynamic random access memory (DRAM) process is performed. Certain processes such as processes for forming gate patterns and bit line patterns may be performed on the substrate 11 before forming the insulation layer.

The insulation layer is formed to provide inter-layer insulation between the substrate 11 and upper layers. The insulation layer may include an oxide-based layer. For instance, the oxide-based layer may include one selected from a group comprising a high density plasma (HDP) oxide layer, a borophosphosilicate glass (BPSG) layer, a phosphosilicate glass (PSG) layer, a borosilicate glass (BSG) layer, a tetraethyl orthosilicate (TEOS) layer, an undoped silicate glass (USG) layer, a fluorine doped silicate glass (FSG) layer, a carbon doped oxide (CDO) layer, an organo silicate glass (OSG) layer, and a combination thereof. The oxide-based layer may also include a layer formed using a spin coating method such as a spin on dielectric (SOD) layer.

A storage node contact plug is formed to pass through the insulation layer, coupled to the substrate 11. In detail, a photoresist pattern exposing a storage node contact region is formed over the insulation layer. The insulation layer is etched using the photoresist pattern as an etch barrier to expose a portion of the substrate 11. A conductive material is buried over the exposed area, and the conductive material is planarized until an upper surface of the insulation layer is exposed, thereby forming the storage node contact plug. For instance, the conductive material may include polysilicon. Consequently, the insulation pattern 12 is formed.

The storage node contact plug is recessed to a certain depth. For instance, the storage node contact plug is recessed in a manner that sidewalls of the storage node contact plug are formed with a sloped profile. Consequently, the recessed storage node contact plug 13 is formed.

Figure 1B:
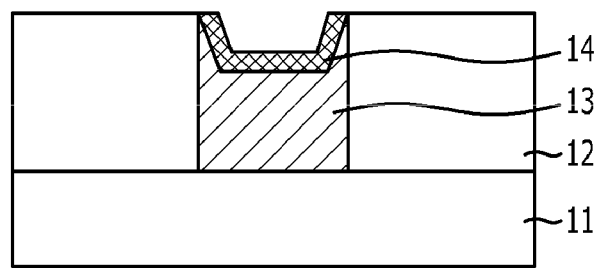

Referring to FIG. 1B, a barrier metal layer 14 is formed over the surface profile of the recessed storage node contact plug 13. The barrier metal layer 14 reacts with the recessed storage node contact plug 13 during subsequent processes to form silicide. Thus, a contact resistance may be improved, and simultaneously, adhesion between a subsequent bottom electrode and the recessed storage node contact plug 13 may be enhanced. For instance, the barrier metal layer 14 may include a titanium (Ti) layer.

In particular, a contact area between the recessed storage node contact plug 13 and the subsequent bottom electrode may be increased, thereby reducing a contact resistance, because the barrier metal layer 14 is formed over the surface profile of the recessed storage node contact plug 13 having the sloped profile.

Figure 1C:
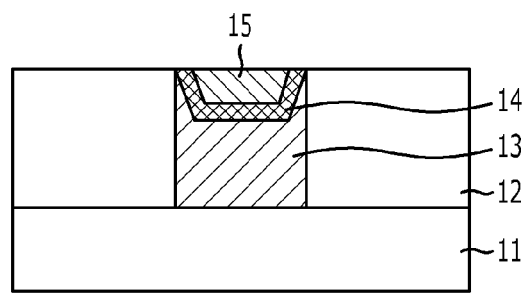

Referring to FIG. 1C, a conductive material layer 15 is formed over the barrier metal layer 14 to fill the recessed portion of the recessed storage node contact plug 13. After forming the conductive material layer 15 in a manner to sufficiently fill the recessed portion of the recessed storage node contact plug 13, an etch process or polish process may be performed so that the conductive material layer 15 is formed flush with the height of the insulation pattern 12. That is, an etch process or polish process may be performed until the conductive material layer 15 does not remain to extend over the insulation pattern 12 substantially.

For instance, the conductive material layer 15 may include substantially the same material as the barrier metal layer 14 or the recessed storage node contact plug 13. According to another example, the conductive material layer 15 may include a material having polarity.

Figure 1D:
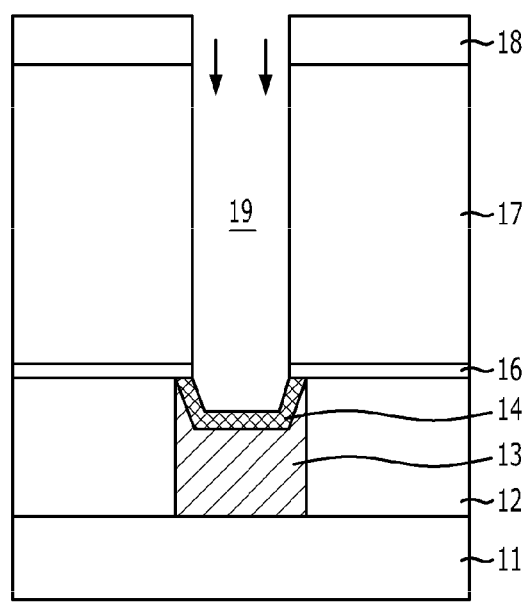

Referring to FIG. 1D, an etch stop pattern 16, a sacrificial pattern 17, and a photoresist pattern 18 are formed over the substrate structure.

In detail, an etch stop layer is formed over the substrate structure. The etch stop layer is formed to protect the insulation pattern 12 from getting damaged when forming an opening for forming the subsequent bottom electrode.

The etch stop layer may include a material having a selectivity with respect to the insulation pattern 12 and the subsequent sacrificial pattern 17. For instance, if the insulation pattern 12 and the sacrificial pattern 17 include an oxide-based layer, the etch stop layer may include a nitride-based layer.

A sacrificial layer is formed over the etch stop layer. The sacrificial layer is formed to provide the opening for forming the subsequent bottom electrode. The sacrificial layer may include an oxide-based layer. The oxide-based layer may include one selected from a group comprising a HDP oxide layer, a BPSG layer, a PSG layer, a BSG layer, a TEOS layer, an USG layer, a FSG layer, a CDO layer, an OSG layer, and a combination thereof. The oxide-based layer may also include a layer formed using a spin coating method such as an SOD layer.

The photoresist pattern 18 is formed over the sacrificial layer. Before forming the photoresist pattern 18, an anti-reflective coating layer may be additionally formed over the sacrificial layer to prevent reflection during a photo-exposure process of the photoresist pattern 18. Also, a hard mask layer may be additionally formed to secure an etch margin.

The sacrificial layer and the etch stop layer are etched using the photoresist pattern 18 as an etch barrier. The sacrificial layer is etched using an oxide layer etch gas. At this time, the etching stops at the etch stop layer which includes a nitride-based layer and thus the insulation pattern 12 formed below the etch stop layer is prevented from getting damaged.

The etch stop layer is etched using a nitride layer etch gas. At this time, the insulation pattern 12 which includes an oxide-based layer may not be damaged due to the selectivity. Furthermore, in order to secure a contact characteristic between the subsequent bottom electrode and the recessed storage node contact plug 13, the etch process of the etch stop layer may include performing a sufficient level of over etch so that the etch stop layer does not remain.

For instance, when the conductive material layer 15 and the barrier metal layer 14 include a material different from each other, the over etch of the etch stop layer may be performed until the entire conductive material layer 15 is etched away and the barrier metal layer 14 is exposed.

After the sacrificial layer and the etch stop layer are etched, an opening 19 exposing the barrier metal layer 14 is formed, and the etch stop pattern 16 and the sacrificial pattern 17 are also formed.

Figure 1E:
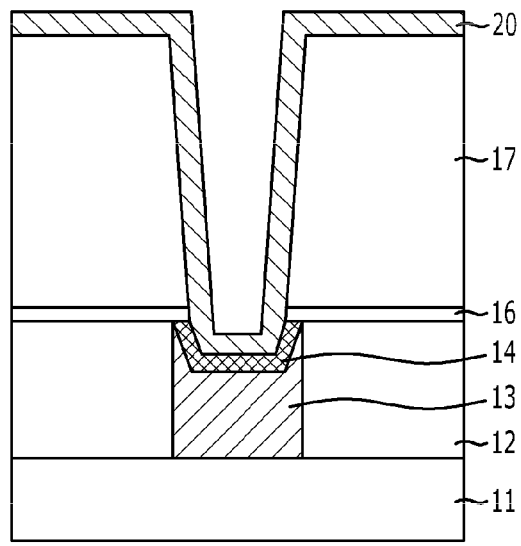

Referring to FIG. 1E, the photoresist pattern 18 is removed. The photoresist pattern 18 may be removed using a dry etch process, and the dry etch process may include performing an oxygen removal process.

A bottom electrode conductive layer 20 is formed over the surface profile of the substrate structure. For instance, the bottom electrode conductive layer 20 may include a titanium nitride (TiN) layer. Meanwhile, adhesion between the bottom electrode conductive layer 20 and the recessed storage node contact plug 13 may be enhanced because the barrier metal layer 14 formed over the recessed storage node contact plug 13 functions as an adhesive layer.

Figure 1F:
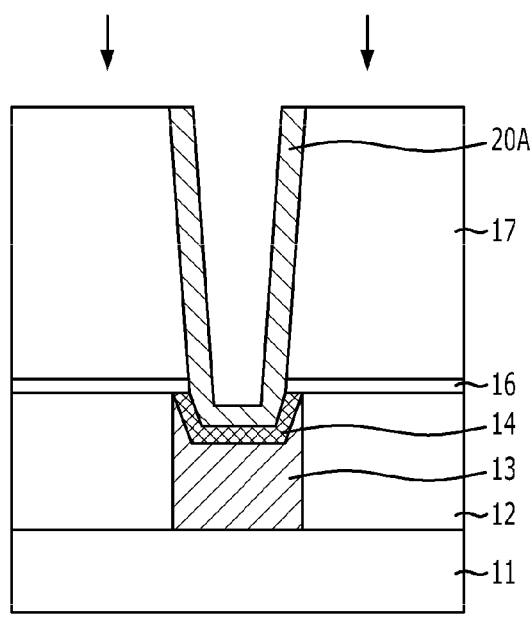

Referring to FIG. 1F, portions of the bottom electrode conductive layer 20 formed over the sacrificial pattern 17 may be etched or polished to form a bottom electrode 20A.

Because the barrier metal layer 14 for improving adhesion of the recessed storage node contact plug 13 is formed locally over the recessed storage node contact plug 13, the etch or polish process for forming the bottom electrode 20A is mainly performed on a single layer of the bottom electrode conductive layer 20. Therefore, when forming a stack structure of an adhesive layer and a conductive layer to improve adhesion of the bottom electrode conductive layer 20, residues of the adhesive layer may be prevented from remaining behind due to a selectivity between layers.

Figure 1G:
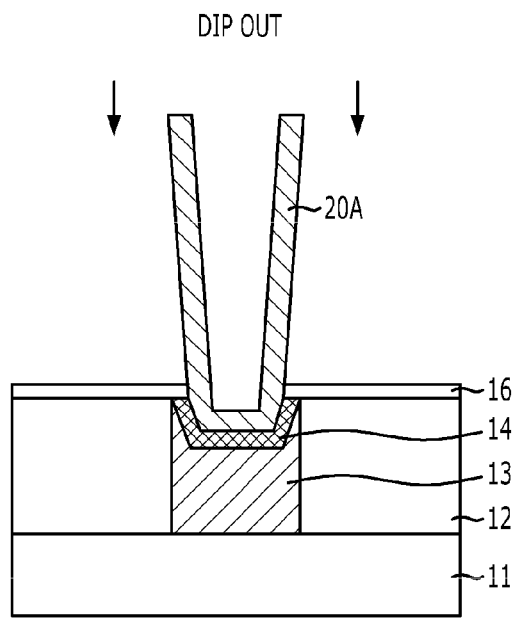

Referring to FIG. 1G, a dip out process is performed to form the bottom electrode 20A having a cylinder shape. As shown in FIG. 1E, the bottom electrode conductive layer 20 is formed over the barrier metal layer 14 having the sloped profile. Thus, the bottom electrode 20A has a better supporting strength at the bottom than when a bottom electrode is formed with a flat bottom profile. Consequently, collapsing of the bottom electrode 20A may be prevented during the dip out process.

Furthermore, the etch stop pattern 16 prevents a wet solution from penetrating into lower layers, thereby preventing the insulation pattern 12 from getting damaged.

Figure 1H:
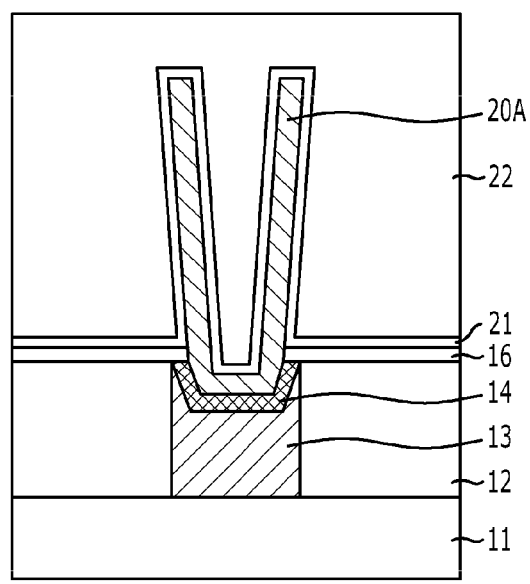

Referring to FIG. 1H, a dielectric layer 21 is formed over the surface profile of the substrate structure. The dielectric layer 21 may include an insulating material. For instance, the dielectric layer 21 may include a zirconium dioxide ($ZrO_2$)/aluminum oxide ($Al_2O_3$)/$ZrO_2$ structure.

An upper electrode 22 is formed over the dielectric layer 21 to form a cylinder type capacitor. The upper electrode 22 may include substantially the same material as the bottom electrode 20A or other types of conductive layers. Also, the upper electrode 22 may be formed over the surface profile of the dielectric layer 21, or the upper electrode 22 may be buried over the bottom electrode 20A.

As described above, forming the barrier metal layer 14 after recessing the storage node contact plug to a certain depth to obtain the sloped profile may increase the contact area by as much as the sloped profile, and thus, a contact resistance may be decreased.

Furthermore, forming the bottom electrode 20A after forming the barrier metal layer 14 over the recessed storage node contact plug 13 may secure as much a storage capacity (Cs) as the recessed portion of the recessed storage node contact plug 13 without increasing the height of the capacitor.

Moreover, recessing the storage node contact plug provides a stronger supporting strength at the bottom of the bottom electrode 20A than when a typical bottom electrode having a flat bottom profile is formed. Consequently, collapsing of the bottom electrode 20A may be prevented during the dip out process.

Also, forming the barrier metal layer 14 locally over the recessed storage node contact plug 13 may prevent residues from occurring due to the selectivity between layers when an adhesive layer is used for adhesion of the bottom electrode 20A. Therefore, bridges which may occur because of residues generated between capacitors may be prevented.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a capacitor in a semiconductor device, comprising:
    forming an insulation layer over a substrate;
    forming a storage node contact plug passing through the insulation layer and coupled to the substrate;
    recessing the storage node contact plug to a certain depth to obtain a sloped profile;
    forming a barrier metal over the surface profile of the recessed storage node contact plug;
    forming a sacrificial layer over the substrate structure;
    etching the sacrificial layer to form an opening exposing the barrier metal;
    forming a bottom electrode over the surface profile of the opening; and
    removing the etched sacrificial layer.

2. The method of claim 1, wherein the forming of the storage node contact plug comprises using polysilicon.

3. The method of claim 1, wherein the forming of the barrier metal comprises using a titanium layer.

4. The method of claim 1, further comprising, before the forming of the sacrificial layer, forming a conductive material layer over the barrier metal.

5. The method of claim 4, wherein the conductive material layer comprises substantially the same material as the barrier metal or the storage node contact plug.

6. The method of claim 4, further comprising, before the forming of the sacrificial layer, forming an etch stop layer over the substrate structure including the conductive material layer.

7. The method of claim 1, wherein the forming of the bottom electrode comprises using a titanium nitride layer.

8. The method of claim 1, wherein the forming of the insulation layer and the forming of the sacrificial layer comprise using an oxide-based layer.

9. The method of claim 8, wherein the removing of the etched sacrificial layer comprises performing a dip out process.

* * * * *